United States Patent [19]

Garcia et al.

[11] Patent Number: 5,753,299
[45] Date of Patent: May 19, 1998

[54] METHOD AND APPARATUS FOR FORMING TERMINATION STRIPES

[75] Inventors: Douglas Garcia; Vernon Cooke, both of San Diego County, Calif.

[73] Assignee: Electro Scientific Industries, Inc., Portland, Oreg.

[21] Appl. No.: 702,900

[22] Filed: Aug. 26, 1996

[51] Int. Cl.⁶ .................................................. B05D 5/12
[52] U.S. Cl. ...................... 427/96; 427/146; 427/267; 427/286
[58] Field of Search ...................... 427/96, 146, 267, 427/286

[56] References Cited

U.S. PATENT DOCUMENTS

| | | | |
|---|---|---|---|
| 4,343,833 | 8/1982 | Sawae et al. | 427/96 |
| 4,395,184 | 7/1983 | Braden | 414/417 |
| 4,603,060 | 7/1986 | Mitsuda et al. | 427/115 |
| 4,845,839 | 7/1989 | Brown | 29/620 |
| 5,021,921 | 6/1991 | Sano et al. | 361/321 |
| 5,275,661 | 1/1994 | Nakagawa et al. | 118/425 |
| 5,330,574 | 7/1994 | Nakagawa et al. | 118/120 |

FOREIGN PATENT DOCUMENTS 2274114  7/1994  United Kingdom ............ C23C 26/02

*Primary Examiner*—Benjamin Utech
*Attorney, Agent, or Firm*—Stoel Rives LLP

[57] ABSTRACT

A stripe terminator (18) includes a carrier plate (20) for carrying a matrix of chips (12), a carrier plate shuttle (22) for longitudinally transporting the carrier plate (20) along guide rails (24), a paste platen (26), a doctor blade for spreading a paste layer (30) on platen (26) and a paste transfer assembly (32) for transferring paste from the platen (26) to the chips (12). The carrier plate (20) is reciprocated as the paste is applied to the chips (12) to form more uniform termination stripes (14) with wraparound segments (16). A novel ribbed paste tray (72) and contoured doctor blade (74) are also disclosed for bottom side paste application.

12 Claims, 8 Drawing Sheets

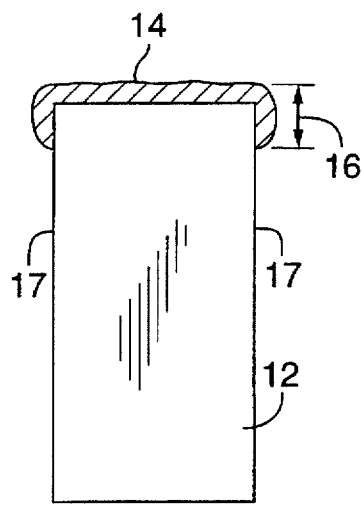
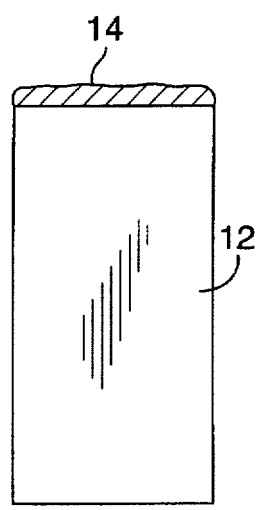
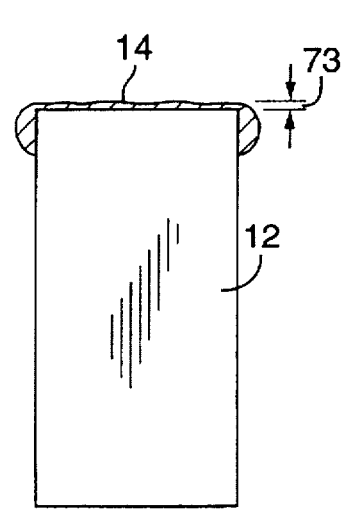
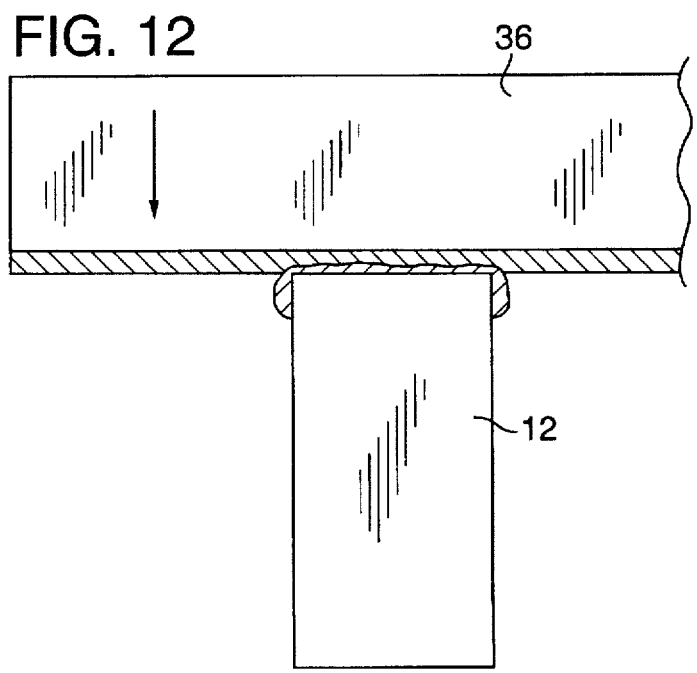
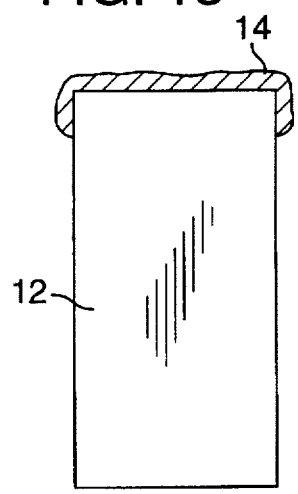

METHOD AND APPARATUS FOR FORMING TERMINATION STRIPES

FIELD OF THE INVENTION

The present invention relates generally to manufacturing chip components and, in particular, to a method and apparatus for forming termination stripes on an end surface of an array chip.

BACKGROUND OF THE INVENTION

Chip components typically include a number of metallic and semi-conductor layers formed in a ceramic body. The various layers can be configured and selectively interconnected to form a variety of circuit components. In order to connect the chip components to external circuitry, e.g., a printed circuit board, the chip components typically include external electrodes or soldering pads.

In the case of array chips, for example, a capacitor array, it is often desired to provide multiple electrodes in the form of stripes on an end surface of the chip. The stripes can be applied to the chip as lines of conductive paste such as silver paste, nickel paste, or other conductive metallic paste. In order for these termination stripes to function properly, the stripes must generally be electrically isolated from one another, that is, application of the paste must be controlled to avoid undesired cross-stripe metallic contact. In addition, it is generally important to avoid any discontinuities in the termination stripe and, relatedly, to apply the stripe with a substantially uniform thickness and width over the length of the stripe. It is also important that the termination stripes remain securely adhered to the chip surface.

Termination stripes are conventionally formed by screen printing or by dipping a ridged metal plate into paste and then carefully pressing the plate downward against the chip surface to effectively stamp paste onto the chip. However, screen printing can produce stripe non-uniformities stemming from misregistration of the screen applicator on the chip surface. Additionally, where a matrix of chips is to be printed in a single process, the chips need to be the same height because the screen is taut and does not conform well to varying heights. Loosening the screen tautness allows better conformance to varying chip heights but compromises registration. Similarly, the ridged plate paste application technique tends to be intolerant of varying chip heights. The ridged plate technique can also result in stripe non-uniformities and adhesion problems.

SUMMARY OF THE INVENTION

The method and apparatus of the present invention provide substantially uniform termination stripes across an end surface of a chip component. In addition, the stripes include wraparound segments that extend onto the side of the chip adjacent to the end surface. The wraparound segments facilitate interconnection to external circuitry and enhance adhesion. Additionally, the stripes can be applied in a manner that accommodates some variation in chip height, thereby allowing for greater manufacturing tolerances.

According to one aspect of the present invention, an apparatus is provided for applying substantially uniform stripes on end surfaces of chips. The apparatus includes a carrier for carrying at least one chip such that an end surface of the chip is exposed, a paste transfer element for applying paste to the exposed end surface of the chip, a positioning mechanism for establishing contact between the paste transfer element and the exposed end surface of the chip, and a reciprocating mechanism for providing relative reciprocating motion between the paste transfer element and the exposed end surface. The apparatus thereby defines an elongate stripe of termination paste on the exposed end surface. Additionally, by allowing the paste transfer element to extend beyond the edges of the exposed end surface during the reciprocation motion, wraparound segments are formed on the side surfaces of the chip adjacent to the exposed end surface, thereby increasing adhesion and facilitating interconnection to external circuitry.

Preferably, the carrier carries a matrix of chips arranged in rows and columns and the paste transfer element includes a plate with a number of elongate ribs, where each rib extends across the length of a column of chips. The ribs are spaced so as to form a number of stripes on each chip. The apparatus can be configured so that the carrier is disposed beneath the transfer element, or vice versa. In addition, the carrier and/or the transfer element can be moved to establish contact, i.e., to establish a closely abutting relationship such that paste can be transferred from the transfer element to the exposed chip surface. Similarly, either or both of the transfer element and carrier can be moved to provide the relative reciprocating motion. The paste transfer element can be "charged" with paste by dipping the element in paste or by applying paste onto the element. The present invention also includes a method for applying termination stripes corresponding to the apparatus as thus described.

According to another aspect of the present invention, the ribs of the transfer element are formed from resilient material. The resilient material is preferably resistant to degradation due to exposure to the termination paste. The ribs can be formed, for example, from various elastomeric materials such as 50 SA durometer rubber. The resilient ribs accommodate some variation in chip height and help to form the wraparound segments, particularly when employed in conjunction with a reciprocating motion. The profile of the ribs can be selected to reduce lateral deflection of the ribs and to enhance uniformity of paste application. In one embodiment, the chip contact surfaces of the ribs are concave in form, each such surface having extended lateral edges for defining the corresponding edges of the termination stripe formed on the chip surface. The ribs preferably further include sloped sidewalls that define a rib profile that progressively widens from the contact surface to a base portion of the rib.

According to another aspect of the present invention, a method and apparatus are provided for reducing problems associated with paste drying. When the paste transfer element is charged by dipping the transfer element into a thin layer of paste on a flat platen, the paste can dry on the platen or transfer element, requiring periodic cleaning. It will be appreciated that dry paste may perform improperly or adversely affect termination stripe definition. It has been found that such drying problems can be reduced by flooding the transfer element with paste periodically, or between paste application cycles.

An apparatus constructed in accordance with this aspect of the invention comprises an upwardly facing paste transfer plate having ribs extending from a top surface of the platen and further including paste retaining sidewalls at the lateral edges of the plate. The side walls extend upwardly from the plate further than the ribs, so that the ribs can be flooded or covered with paste retained by the sidewalls. A novel contoured doctor blade is provided for removing excess paste from the transfer plate, for example, in preparation for a chip pasting process. The contoured doctor blade has a profile that generally corresponds to the lateral profile of the paste transfer plate, including fingers for extending into grooves between adjacent ribs of the transfer element. In operation, the paste is applied on the upper surface of the paste transfer plate, and retained by the sidewalls, until the ribs are covered. The contoured doctor blade is then longitudinally wiped over the upper surface of the paste transfer plate between the sidewalls such that the fingers of the blade travel in the grooves between the ribs. The fingers thus remove excess paste from the transfer plate such that the ribs can apply discrete termination stripes on the chip surface, substantially free from any undesired cross-stripe metallic paste interconnection. The stripes are formed by establishing contact between the upper transfer plate and a bottom surface of a chip or chips. Preferably, a reciprocating motion is also employed to form the stripes. It will be appreciated that the contours of the doctor blade need not match the profile of the transfer element precisely, so long as sufficient paste is removed to provide stripe separation. In this regard, the upward orientation of the transfer element facilitates stripe separation, as any excess paste will tend to gravitate to the bottom of the grooves between the ribs.

BRIEF DESCRIPTION OF THE DRAWINGS

For a more complete understanding of the present invention and further advantages thereof, reference is now made to the following detailed description taken in conjunction with the drawings in which:

FIGS. 6, 7, 8 and 9 illustrate a reciprocating motion for forming the termination stripes including the wrap-around segments, according to the present invention;

FIG. 10 shows a chip component with a terminator stripe formed without reciprocation;

FIGS. 11, 12 and 13 illustrate a process for forming a termination stripe including a secondary dipping step, according to the present invention;

DETAILED DESCRIPTION OF THE INVENTION

The invention is set forth below with respect to two exemplary embodiments and various associated methodologies. FIGS. 2–13 generally relate to a top side stripe terminator for applying termination stripes on top surfaces of chips. FIGS. 14–18 generally relate to a bottom side stripe terminator for applying termination stripes to chip bottom surfaces. It will be appreciated that other implementations of the present invention are possible.

Figure 1:
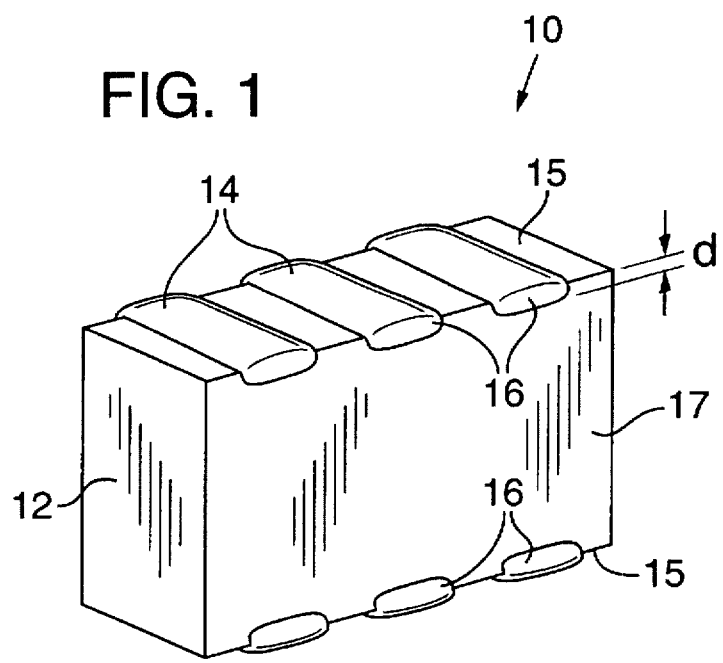
FIG. 1 is a perspective view showing termination stripes formed on end surfaces of a chip component, in accordance with the present invention.

FIG. 1 shows a chip component 10 constructed in accordance with the present invention. The chip component 10 can be constructed using either of the stripe terminator embodiments described in detail below. The chip component 10 includes a body or chip 12 with a number of termination stripes 14 formed on its end surfaces 15. The chip 12 is typically formed from a ceramic material or other material having appropriate electrical and mechanical properties. Layers of internal conductive electrodes and semi-conductor materials can be configured in the chip 12 to form various circuit components. Such circuit components typically include a cap metal layer or other electrode for establishing contact with one of the external termination stripes 14. The chip component 10 may comprise, for example, a capacitor array.

Each of the stripes 14 on the illustrated chip component 10 extends across the end surface 15 and includes wrap-around segments 16 that extend a distance, d, over a side surface 17 of component 10 adjacent to the end surface 15. The wrap-around segments 16 facilitate interconnection to external circuitry (for example, a printed circuit board), and also improve body/stripe adhesion. The distance, d, is preferably at least about 0.005–0.015 inches and, in the in the illustrated embodiment, is about 0.02 inches. The stripes 14 are formed from electrically conductive material and are applied to the body 12 as a conductive metallic paste. The paste is subsequently dried by heating or at ambient temperatures to set the stripes 14. The stripes 14 are separated from one another for electrical isolation but are preferably closely spaced for improved chip density. The stripe spacing and number of stripes per chip are a matter of design and manufacturing tolerances. In the embodiment of FIG. 1, the chip component 10 includes three stripes 14 on each end surface 15. A different number of stripes 14 may be provided (see, e.g., the four stripe embodiment of FIG. 4). The illustrated stripes 14 have a width of about 0.02 inches and are separated by a distance of about 0.02 inches. The dimensions of the end surface 15 of the illustrated chip are about 0.020×0.040 inches.

Figure 2:
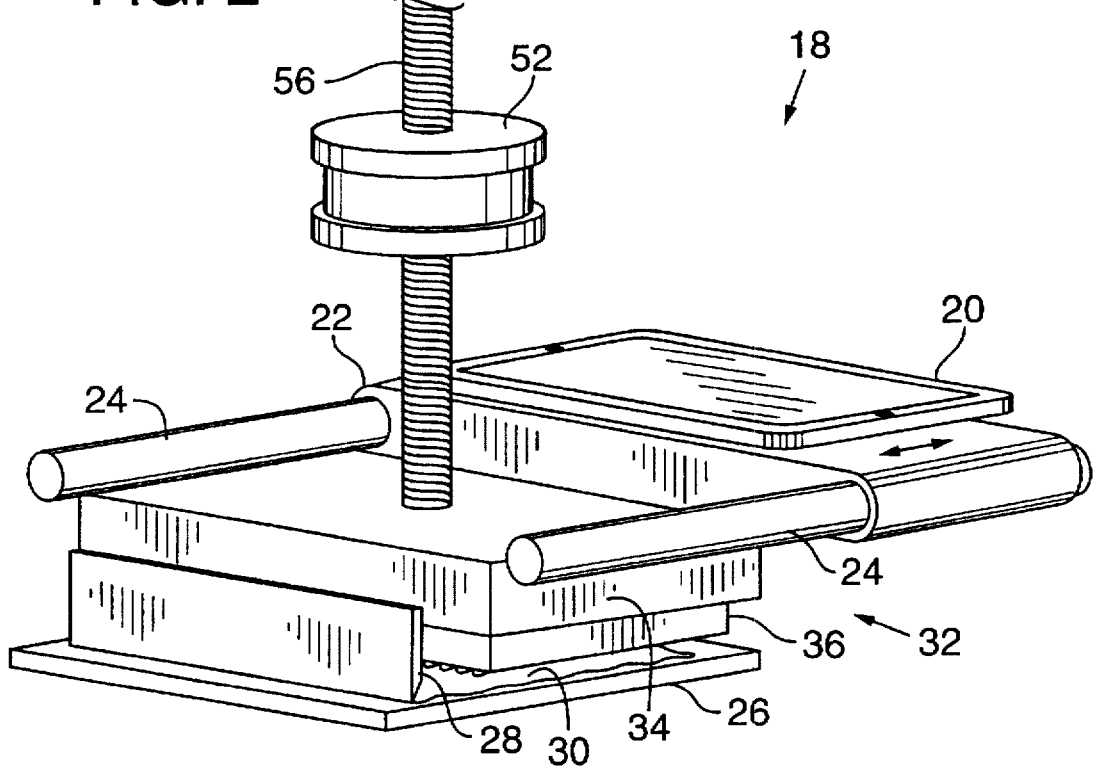
FIG. 2 is a perspective view of a stripe terminator device constructed in accordance with the present invention in its paste dipping configuration.
Figure 3:
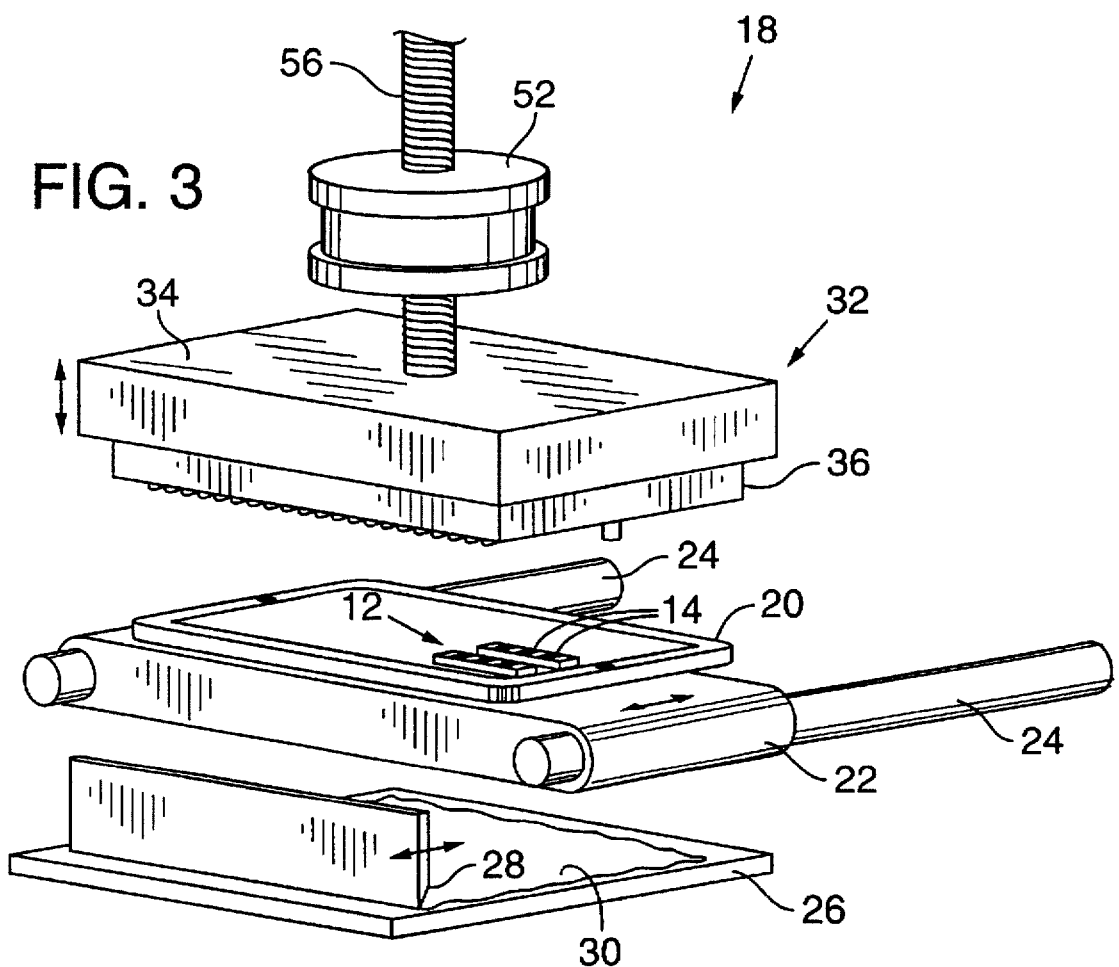
FIG. 3 is a perspective view of the stripe terminator device of FIG. 2 in its paste application configuration.
Figure 4:
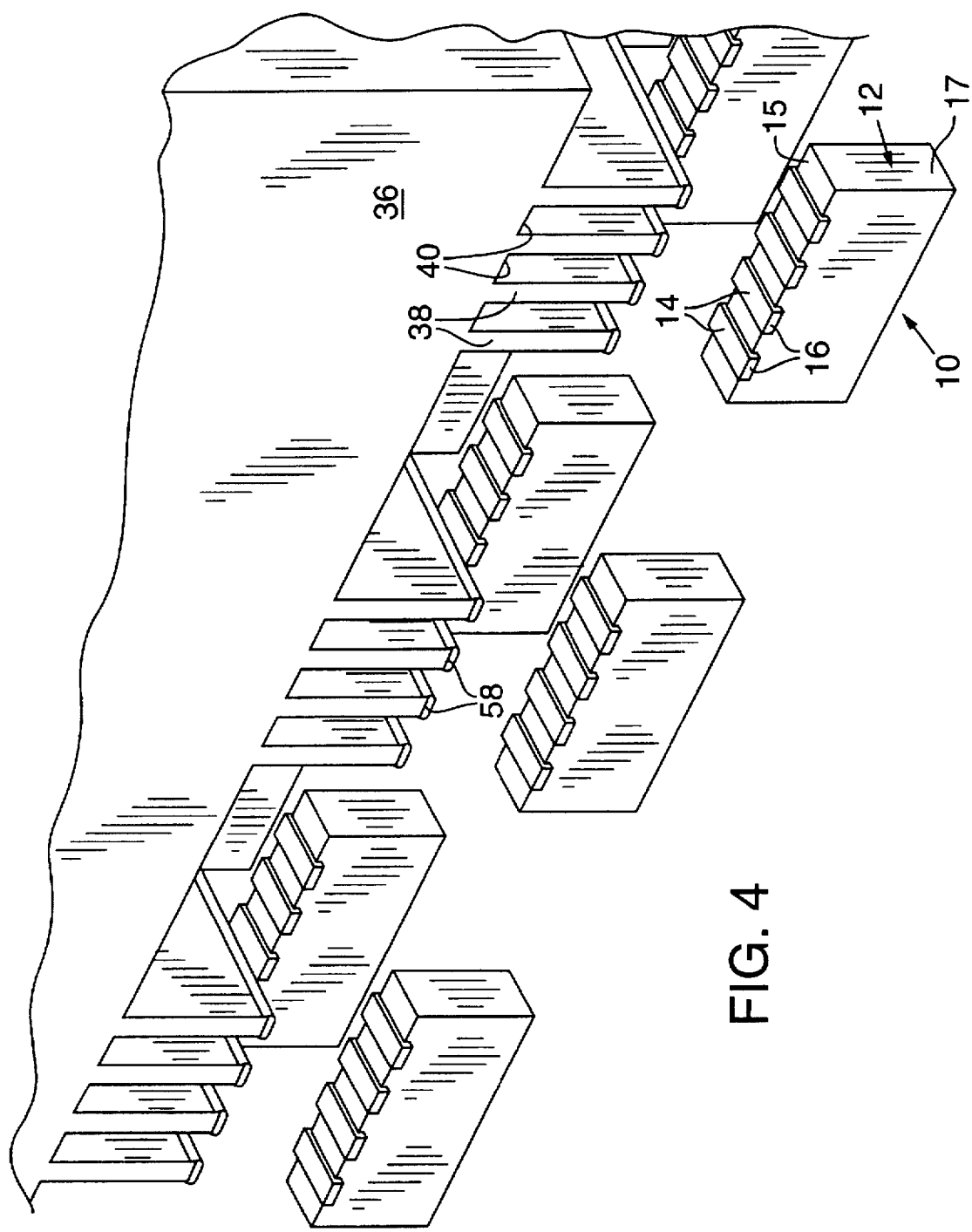
FIG. 4 is a perspective view showing details of the comb plate of the stripe terminator device of FIG. 2.

FIGS. 2–5 illustrate a stripe terminator machine 18 for applying termination stripes 14 to chips 12. Generally, the stripe terminator 18 includes a carrier plate 20 for securely carrying a number of chips 12 (FIG. 3), a carrier plate shuttle 22 for longitudinally carrying plate 20 along guide rails 24, paste platen 26, doctor blade 28 for spreading a paste layer 30 on paste platen 26, and paste transfer assembly 32 for transferring paste from the platen 26 to the chips 12 on carrier plate 20. The paste transfer assembly 32 includes a mounting plate 34 and a comb plate 36. As shown most clearly in FIG. 4, comb plate 36 has a front profile defined by a number of fingers 38 separated by channels 40 for defining the stripes 14 on chips 12, as will be described in greater detail below. FIG. 4 also shows the matrix arrangement of the chips 12 whereby the elongate fingers 38 extend across a column of chips 12 in the matrix.

In FIGS. 2 and 3, the stripe applicator 18 is shown in its paste-dipping and paste application configurations, respectively. The stripe application process is initiated by forming a thin layer of paste 30 on the paste platen 26 in preparation for dipping the comb plate 36 into the paste layer 30. In order to properly coat the comb plate 36 and form the stripes 14, the paste is spread to form a continuous paste layer 30 of substantially uniform thickness beneath the comb plate 36. In this regard, it will be appreciated that voids in the paste 30 could result in stripe discontinuities (although the reciprocation as described below alleviates such concerns to an extent). If the paste 30 is too thick, stripe width and uniformity could be adversely affected. The paste 30 can be metered or spread onto the paste platen 26 to provide the desired thickness. In the illustrated embodiment, the paste 30 is spread onto the platen using doctor blade 28. Doctor blade 28 is preferably formed from metal, such as aluminum or other material that is resistant to degradation due to the paste chemicals and that can be machined or otherwise formed to provide a highly flat spreading edge. The blade 28 can be mounted for longitudinal movement over the paste platen 26 or can be manually operated. The paste platen 26 preferably provides a highly flat surface for improved paste layer thickness uniformity and is also resistant to the paste chemicals. The platen 26 may, for example, be formed from granite.

Figure 5:
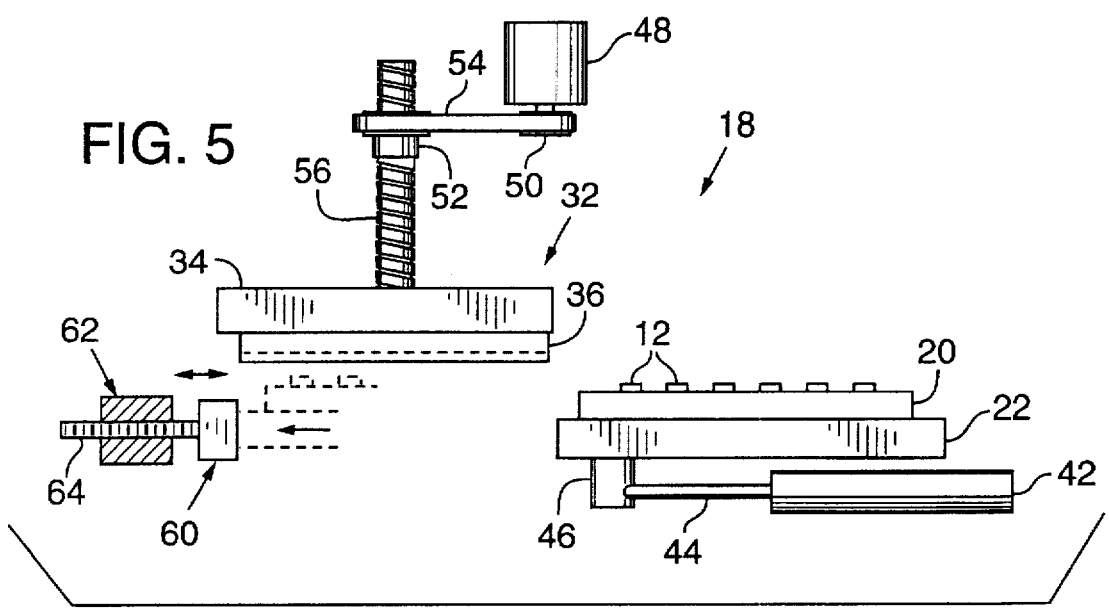
FIG. 5 is a side view showing various drive components of the stripe terminator device of FIG. 2.

In order to apply a charge of paste to the fingers 38 of comb plate 36, the carrier plate 20 and shuttle 22 are longitudinally withdrawn from beneath the paste transfer assembly 32 so that the comb plate 36 can be lowered to contact the paste layer 30. The drive components for effecting such motion are shown in FIG. 5. With respect to the carrier plate shuttle 22, longitudinal movement along guide rails 24 (FIGS. 2–3) is controlled by a pneumatic cylinder 42 that drives piston rod 44. Rod 44 is connected to shuttle mount 46 to drive shuttle 22. Vertical movement of the paste transfer assembly 32 is controlled by motor 48, which may be, for example, a microstep motor. Motor 48 drives drive pulley 50 which is associated with drive press 52 by appropriate linkage such as a drive belt 54 so as to rotate press 52. Press 52 includes a threaded bore for interfacing with leadscrew 56 such that rotation of press 52 results in vertical motion of leadscrew 56 and, in turn, paste transfer assembly 32 which is mounted on leadscrew 56 via mounting block 34.

The paste transfer assembly 32 is thereby moveable between a lowered position (FIG. 2) for paste dipping and a raised position (FIG. 3) for paste application. Additionally, the assembly 32 is also thereby vertically moveable so that the pasted comb plate 36 can contact the end surface 15 of chip 12 so as to transfer paste to the chip 12 and form termination stripes 14. The vertical positioning of the assembly 32 is preferably controlled in response to positional feedback. Such feedback can conveniently be provided by an optical encoder (not shown) mounted on a shaft of the leadscrew 56. The output pulses of such an encoder can be communicated to a microprocessor associated with the motor 48 in conventional fashion to allow for precise positioning of the assembly for paste dipping and application. After dipping the comb plate 36 into the paste layer 30, paste is retained on the ends 58 of the fingers 38 of comb plate 36 as shown in FIG. 4. The illustrated fingers 38 have a depth greater than the thickness of the paste layer 30, thereby improving stripe separation.

To apply paste to the chips 12, the stripe terminator 18 is positioned in the paste application configuration as shown in FIG. 3. This is accomplished by operating motor 48 to raise the paste transfer assembly 32 and operating cylinder 42 to advance the carrier plate 20 and shuttle 22 to a position beneath the comb plate 36. The carrier plate 20 and shuttle 22 are shown in the paste application configuration in phantom in FIG. 5. A stop 60 is provided to ensure proper positioning of the shuttle 22 for paste application. Preferably, the stop 60 is adjustable to accommodate variation in carrier plate 20, shuttle 22, and paste transfer assembly 32 geometry or varying chip layouts.

Once the shuttle 22 is properly positioned, motor 48 is operated to lower the assembly 32 so that the pasted comb plate 36 contacts the exposed end surfaces 15 of the chips 12. It has been found that wiping or reciprocating the comb plate 36 results in more uniform termination stripe formation and provides suitable wraparound segments 16 for improved adhesion and simplified electrical interconnection. Accordingly, reciprocating motor 62, which may be a microstop motor or the like, is employed in the illustrated embodiment to provide a longitudinal reciprocating motion at a time when the pasted comb plate 36 is in contact with the chips 12. The reciprocating motor 62 drives reciprocating leadscrew 64 which is mounted to stop 60. The stop 60 can engage the shuttle 22, e.g., by clamping, or the motor 62 can act against pressure from cylinder 42 in order to impart the reciprocating motion to shuttle 22. Only a short reciprocating stroke length is required to achieve the desired effects. In this regard, stroke lengths on the order of 0.02 inches have provided satisfactory results. It will be appreciated that the chips 12 are held securely in place on carrier plate 20 throughout the process, for example, by suction applied through chip retaining openings in the carrier plate 20.

Figure 6:
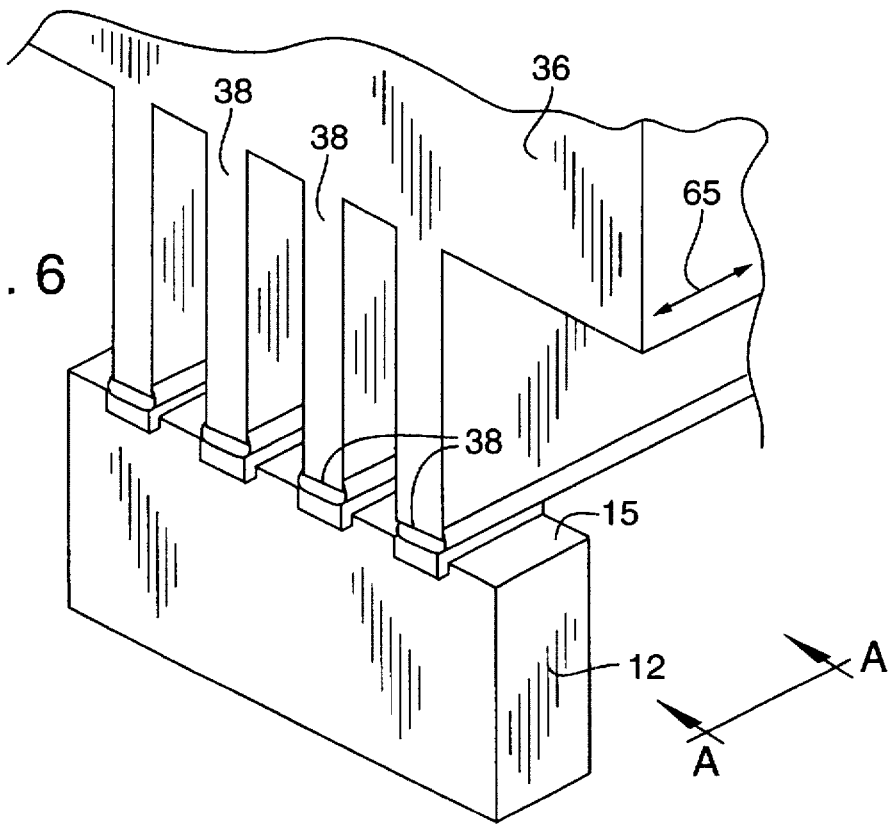
Figure 7:
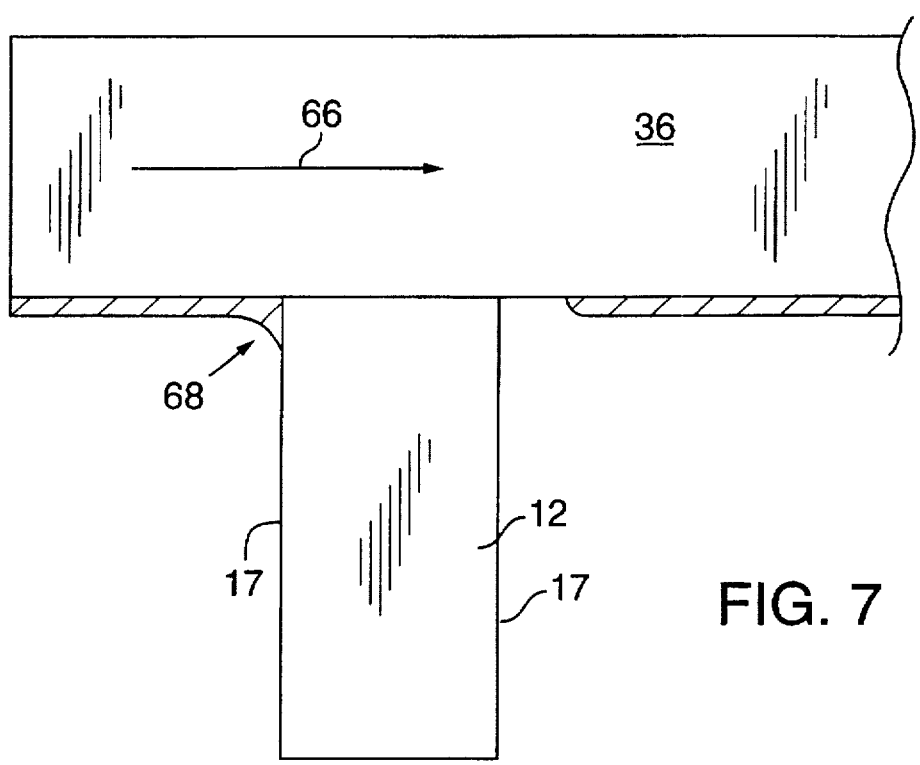
Figure 8:
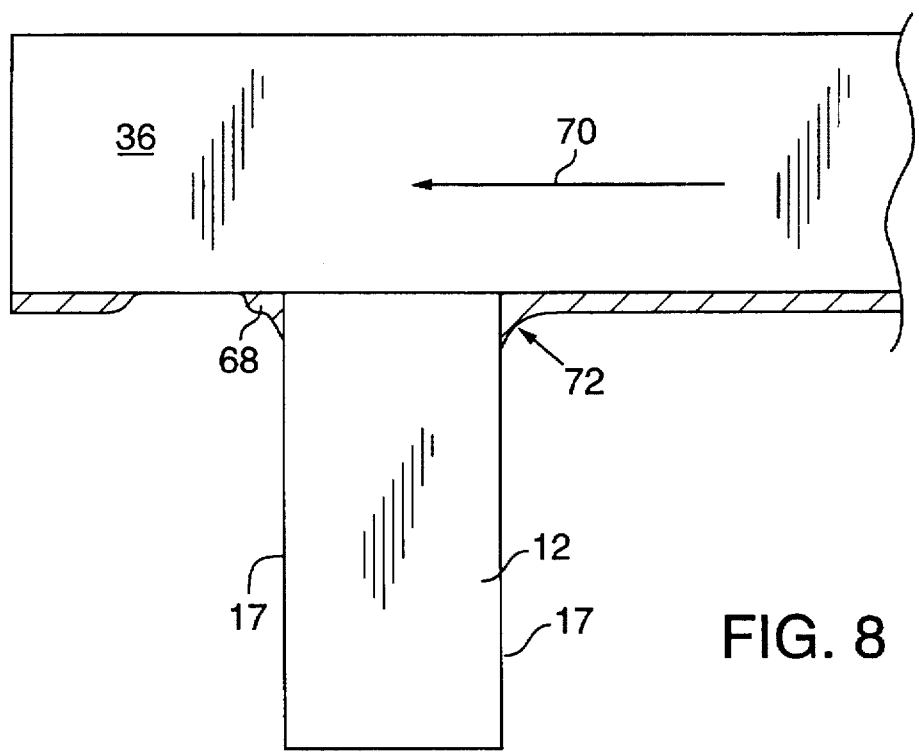
Figure 14:
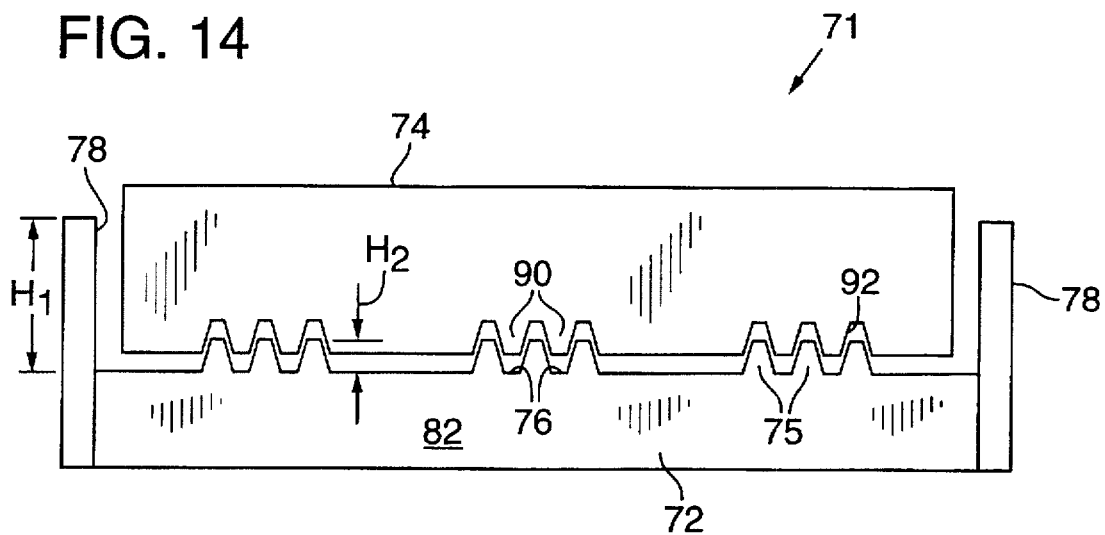
FIG. 14 is an end view of a paste applicator tray and contoured doctor blade, constructed in accordance with an alternative embodiment of the present invention.

FIGS. 6–9 illustrate the reciprocating motion and related effects. FIG. 6 is a perspective view showing the interface between the comb plate 36 and a chip 12. Arrows 65 show the direction of the reciprocating motion. FIGS. 7–8 are side views as indicated by cut line A—A of FIG. 6. FIG. 7 represents the forwardmost position of the reciprocating motion, i.e., the position of comb plate 36 immediately after it begins its rearward stroke as indicated by arrow 66. As shown the forward stroke has resulted in formation of paste bead 68 on the side surface 17 of chip 12 corresponding to front edge of chip 12. FIG. 8 represents the rearwardmost position of the reciprocating motion, i.e., the position of comb plate 36 immediately after it begins its forward stroke as indicated by arrow 70. It will be observed that the rearward stroke has resulted in formation of a paste bead 72 on the side surface 17 of chip 12 corresponding to the back edge of chip 12. Multiple stroke cycles can be used to form the termination stripes 14. Motor 48 is then operated to raise the paste transfer assembly 32 from the chip 12. The result of the reciprocating motion and bead formation is a termination stripe 14 with approximately 0.020 inch wraparound segments 16 as shown in FIG. 9, as contrasted to stripes 14 with little or no wraparound formed without reciprocation as shown in FIG. 10.

In some cases, it may be desired to employ a multi-dipping process as generally illustrated in FIGS. 11–13. It has been found that parts formed with a single touch-and-reciprocate motion as described above sometimes have a thin termination stripe 14 as generally shown by arrows 73 in FIG. 11. In order to increase stripe thickness, the chip 12 can be pasted a second time (or repeatedly) by redipping the comb plate 36 into the paste layer 30 (FIGS. 2–3) and then contacting the plate 36 to the chip 12 as shown in FIG. 12. It is generally not necessary to repeat the reciprocating step. FIG. 13 shows the finished part of the multi-dipping process with improved stripe thickness.

FIGS. 14–18 show a paste transfer assembly 71 constructed in accordance with an alternative embodiment of the present invention. The assembly 71 generally includes a paste transfer tray 72 for applying termination stripe paste to a chip, and a contoured doctor blade 74 for removing excess paste from the tray 72. The assembly 71 is used in conjunction with a bottom side stripe terminator for applying termination stripes to exposed bottom surfaces of a matrix of chips. It will be appreciated that the bottom side stripe terminator employs a carrier plate shuttle in which the chips are supported such that paste can be applied to a bottom chip end surface 15. Likewise, the paste transfer tray 72 is positioned beneath the carrier plate 20, and is raised to engage the exposed chip end surfaces 15. Operationally, the bottom side stripe terminator machine includes a shuttle drive cylinder, paste transfer motor and reciprocating motor that generally function in the same manner as the corresponding components described above, with the exception of the mirror image (bottom side) operation of the paste transfer assembly 71.

Figure 17:
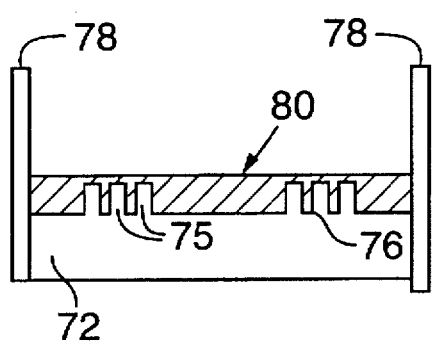
FIG. 17 is an end view showing the paste tray of FIG. 14 flooded with paste.

The paste transfer tray 72 includes a number of elongate paste transfer fingers 75 separated by elongate grooves 76 and paste retaining sidewalls 78 at each side edge of the tray 72. The illustrated sidewalls extend a height, $H_1$, relative to tray base 82, that is greater than the height, $H_2$, of the fingers 75 so that the fingers 75 can be flooded with paste 80 (as shown in FIG. 17) periodically or between paste application cycles. Such flooding of the tray 72, preferably to a depth where the fingers 75 are submerged or covered, reduces problems associated with paste drying.

The base 82 and sidewalls 78 of the tray 72 can be formed from metal or other rigid material such as aluminum. The fingers 75 may also be formed from a rigid material such as aluminum, or may be formed from an elastomeric material. Forming the fingers 75 from an elastomeric material allows the fingers 75 to accommodate chips of slightly varying heights, thereby simplifying the manufacturing process. Additionally, elastomeric fingers 75 assist in forming adequate wraparound segments of the termination stripes, particularly when employed in conjunction with a reciprocating paste application motion. Preferably, the elastomeric material is resistant to degradation due to chemicals in the termination paste. Although many elastomeric materials may be used, the illustrated fingers 75 are formed from 50 SA durometer rubber. The fingers 75 are preferably removably attached to the base 82, for example, by way of a sliding tongue-and-groove arrangement or by screws, bolts or the like (not shown).

Figure 18:
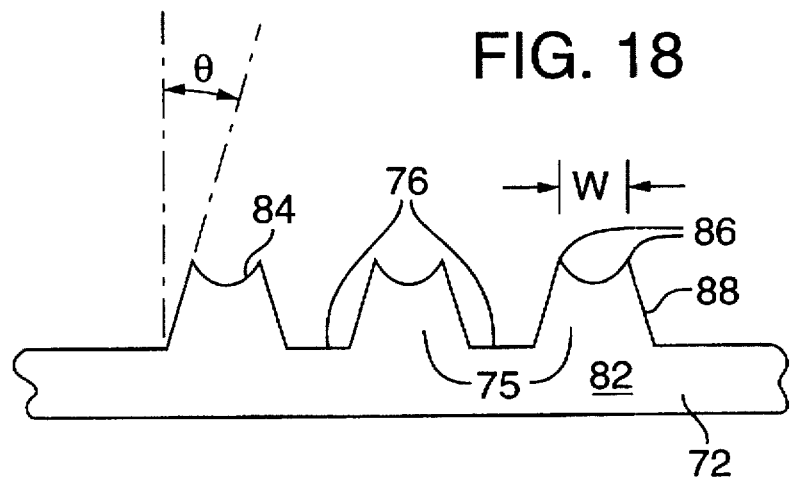
FIG. 18 shows an end profile of a portion of the paste tray of FIG. 14.

FIG. 18 shows a preferred profile of the tray 72. As shown, the fingers 75 include a concave, arcuate chip contact surface 84 including raised edges 86. This surface shape is believed to provide improved conformance to chip height variations and enhanced stripe definition. The concave surface shape is also believed to provide improved paste retention. It is desired that the fingers 75 retain a layer of paste having a thickness, T, (FIG. 16) of at least about 0.005 inches where the thickness is substantially constant across the length of the fingers 75. The raised edges 86 define a contact surface width, w, of about 0.010 inches. The illustrated fingers 75 further include sloped sides 88 such that the finger width is wider at the base 82 than at the contact surface 84. The illustrated sides 88 are sloped at an angle θ of about 15°. This profile reduces lateral deflection of the fingers 75 and facilitates proper tray/doctor blade meshing.

Figure 15:
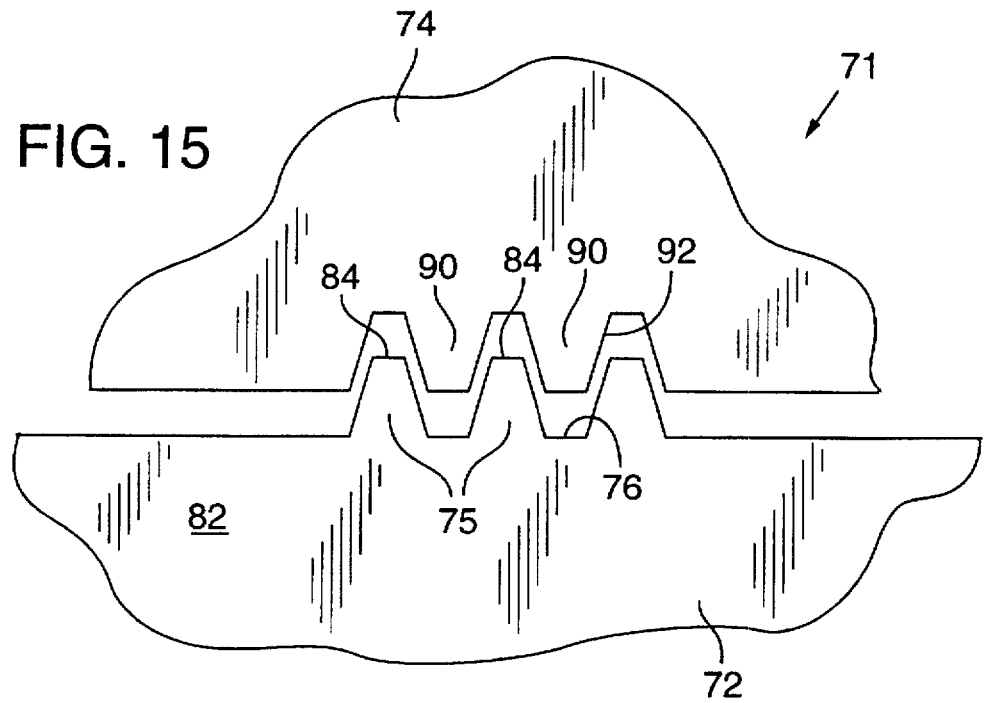
FIG. 15 is an end view showing details of the paste tray/doctor blade interface of the embodiment of FIG. 14.
Figure 16:
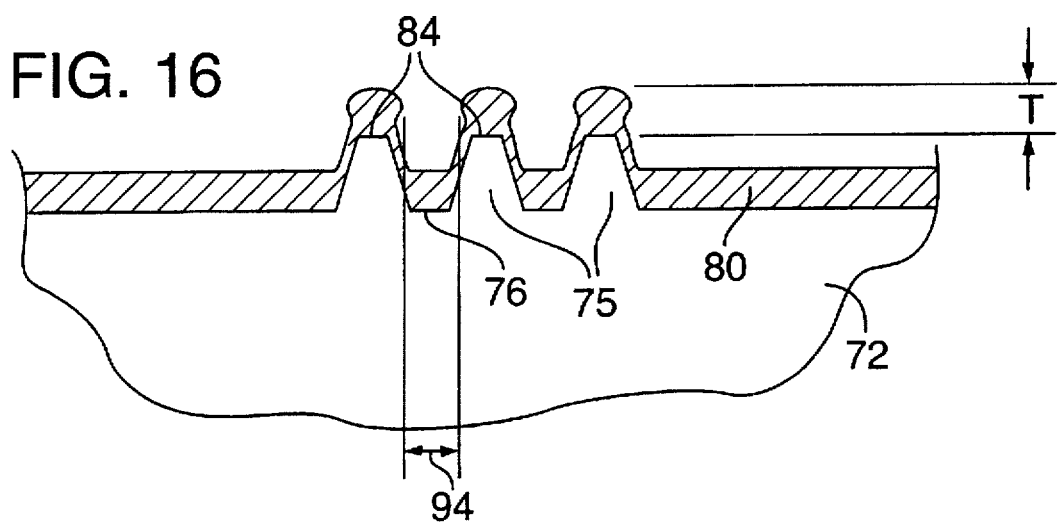
FIG. 16 is an end view showing the paste tray of FIG. 14 carrying a charge of paste.

The doctor blade 74 is generally contoured to complement the profile of the tray 72. In this regard, the doctor blade 74 includes a number of blade fingers 90 that are dimensioned and spaced to be received within the tray grooves 76, and further includes recesses 92 between the blade fingers 90 that are dimensioned and spaced to receive the tray fingers 75. As illustrated in FIG. 15, the fit between the tray 72 and the doctor blade 74 does not need to be exact so long as the blade fingers 90 extend into the tray grooves 76 to provide a gap 94 (FIG. 16) between successive contact surfaces 84 sufficient to avoid bridging. The gap 94 between successive contact surfaces 84 is preferably at least about 0.010 inches to substantially prevent undesired cross-stripe contact.

In operation, a termination stripe application process is normally initiated by flooding the tray 72 with paste 80 so that the fingers 75 are covered. The contoured doctor blade 74 is then wiped longitudinally over the tray 72 such that the blade fingers 90 travel in the tray grooves 76 to remove excess paste 80 and provide separation between successive chip contact surfaces 84. Due to the upwardly facing orientation of the tray, 72 excess paste 80 will tend to gravitate towards the base of tray 72, further enhancing separation.

The tray 72 is then raised so that the chip carrier plate is received between the paste retaining sidewalls 78 and the tray fingers 75 contact the exposed bottom surfaces of the chips to form termination stripes. The carrier tray can be reciprocated while maintaining chip/finger contact to provide improved stripe wraparound segments. The tray 72 is then lowered away from the chips and may again be flooded with paste 80 for recharging and to reduce paste drying.

While various embodiments and applications of the present invention have been described in detail, it is apparent that further modifications and adaptions of the invention will occur to those skilled in the art. However, it is to be expressly understood that such modifications and adaptations are within the spirit and scope of the present invention.

we claim:

1. A method for use in forming an electrode on a surface of a chip, comprising the steps of:

applying an electrically conductive paste to a transfer member;

establishing contact between said pasted transfer member and said chip surface; and providing reciprocating motion between said chip surface and said pasted transfer member while maintaining contact between said chip surface and said pasted transfer member by providing relative motion in a first direction substantially parallel to said chip surface and in a second direction substantially parallel to said chip surface.

2. A method as set forth in claim 1, wherein said step of applying comprises dipping said transfer member in said electrically conductive paste.

3. A method as set forth in claim 1, wherein said step of applying comprises providing a thin layer of paste on a flat surface and dipping said transfer member in said paste layer.

4. A method as set forth in claim 1, wherein said step of applying comprises covering said transfer member with paste and removing excess paste from said transfer member.

5. A method as set forth in claim 4, wherein said step of removing excess paste comprises wiping a blade across said transfer member.

6. A method as set forth in claim 1, wherein said transfer member comprises a ribbed plate including an elongate groove, said blade includes at least one extruding finger and said step of wiping comprises passing said blade across a transfer member such that said finger travels in said groove.

7. A method as set forth in claim 1, wherein said step of applying comprises providing a substantially uniform thickness of paste over a length of said transfer member.

8. A method as set forth in claim 1, wherein said step of establishing contact comprises moving at least one of said pasted transfer member and said chip surface so that a lower surface of said transfer member contacts said chip surface.

9. A method as set forth in claim 1, wherein said step of reciprocating comprises moving said chip surface.

10. A method as set forth in claim 1, further comprising the step of establishing contact between said pasted transfer member and said chip surface a second time.

11. A method for use in forming electrodes on an end surface of a chip, comprising the steps of:

providing a paste tray including a raised paste transfer surface for applying paste to said end surface of said chip;

applying paste to said paste tray so that said paste has a depth sufficient to cover said raised paste transfer surface;

removing a portion of said applied paste so as to expose said raised paste transfer surface; and contacting said raised paste transfer surface to said end surface of said chip.

12. A method as set forth in claim 11, wherein said step of removing comprises wiping a blade across said paste tray.

* * * * *